(12) United States Patent
Fukuda et al.

(10) Patent No.: US 6,337,501 B1
(45) Date of Patent: Jan. 8, 2002

(54) SEMICONDUCTOR DEVICE HAVING BIPOLAR TRANSISTOR AND MOS TRANSISTOR

(75) Inventors: Yutaka Fukuda, Kariya; Atsuo Onozaki, Obu; Junichi Nagata, Okazaki; Kiyoshi Yamamoto, Toyohashi, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/538,490

(22) Filed: Mar. 30, 2000

(30) Foreign Application Priority Data

Apr. 8, 1999 (JP) ............................ 11-101702
Dec. 17, 1999 (JP) ............................ 11-359768

(51) Int. Cl.$^7$ ...................... H01L 27/01; H01L 27/12; H01L 31/0392
(52) U.S. Cl. ...................... 257/350; 257/378
(58) Field of Search ................ 257/133, 378, 257/350

(56) References Cited

U.S. PATENT DOCUMENTS

| | | | |
|---|---|---|---|
| 4,244,001 A | * | 1/1981 | Ipri |
| 4,400,711 A | * | 8/1983 | Avery |
| 4,893,158 A | | 1/1990 | Mihara et al. |
| 4,954,865 A | * | 9/1990 | Rokos |
| 5,247,200 A | * | 9/1993 | Momose et al. ............ 257/378 |
| 5,449,946 A | | 9/1995 | Sakakibara et al. |
| 5,592,015 A | | 1/1997 | Iida et al. |
| 5,679,972 A | * | 10/1997 | Kim ............................ 257/378 |
| 5,781,388 A | | 7/1998 | Quigley |
| 5,932,916 A | | 8/1999 | Jung |

FOREIGN PATENT DOCUMENTS

| | | |
|---|---|---|
| JP | 49-74488 | 11/1972 |
| JP | 53-60582 | 5/1978 |
| JP | 2-4013 | 1/1990 |

* cited by examiner

Primary Examiner—Ngân V. Ngô
(74) Attorney, Agent, or Firm—Law Offices of David G. Posz

(57) ABSTRACT

A semiconductor device in which a bipolar transistor and a MOS transistor are formed in a common element region, which can prevent a circuit layout pattern from being large due to a wiring. A semiconductor device having an element region formed by the $N^-$-type layer, which is isolated and insulated from the other regions. A $P^+$-type base region, an $N^-$-type emitter region, an $N^+$-type collector region, and a $P^+$-type excess carrier removing region for removing excess carrier in the $P^+$-type base region, are commonly formed in particular one $N^-$-type layer. Thus, a bipolar transistor is defined. Furthermore, a gate oxide film is formed on the surface of the $N^-$-type layer where between the $P^+$-type base region and the $P^+$-type excess carrier removing region. A polysilicon layer is formed on the gate oxide film. Thus, a $P^+$-type MOS transistor is defined by using the $P^+$-type base region as a source and the $P^+$-type excess carrier removing region a drain. The $P^+$-type base region, the $P^+$-type excess carrier removing region, the $N^-$-type emitter region, the $N^+$-type collector region, and the polysilicon layer are respectively connected to metallic electrodes. Since the bipolar transistor and the MOS transistor are commonly formed in an element region, and one of regions is commonly used, it can prevent a circuit layout pattern from being large due to a wiring for connecting the bipolar transistor and the MOS transistor.

10 Claims, 9 Drawing Sheets

SEMICONDUCTOR DEVICE HAVING BIPOLAR TRANSISTOR AND MOS TRANSISTOR

CROSS REFERENCE TO RELATED APPLICATION

This application is based upon Japanese Patent Application Nos. Hei. 11-101702 filed on Apr. 8, 1999, and Hei. 11-359768 filed on Dec. 17, 1999, the contents of which are incorporated herein by reference.

BACKGROUND OF THE INVENTION

1. Field of the Invention

This invention relates to semiconductor devices, and particular to a semiconductor device including a bipolar transistor and a insulated gate transistor, and a circuit using the semiconductor device.

2. Related Art

Conventionally, several semiconductor devices in which each element region is separated by being insulated each other by using a PN junction or an insulating film, and in which semiconductor element such as a bipolar transistor or an insulated gate transistor is formed in each of the element regions, have been proposed (JP A 6-267966, JP A 6-268054, etc).

According to the above-described semiconductor devices, the bipolar transistor and the insulated gate transistor are individually formed in separated element regions. Therefore, when the bipolar transistor is electrically connected to the insulated gate transistor, it needs to provide a metallic wire such as aluminum wire. In this case, a circuit layout pattern may become large.

SUMMARY OF THE INVENTION

This invention has been conceived in view of the background thus far described and its first object is to prevent a circuit layout pattern from being large due to a wiring.

Its second object is to provide one of a circuit device, a comparator, and an oscillator, which uses a semiconductor device capable of preventing a circuit layout pattern from being large due to a wiring.

According to the present invention, an element region is formed in the substrate by being isolated and insulated from the other element regions to be formed in the substrate. In a semiconductor layer formed in the element region, a bipolar transistor, which is made up of: a base region having a second conductivity type; an emitter region having the first conductivity type; and a collector region having the first conductivity type, is formed. In this semiconductor layer in which the bipolar transistor is formed, an insulated gate transistor is formed by using the base region as one of a source and a drain thereof.

Since the bipolar transistor and the insulated gate transistor are commonly formed in an element region, and one of regions is commonly used, it can prevent a circuit layout pattern from being large due to a wiring for connecting the bipolar transistor and the MOS transistor.

BRIEF DESCRIPTION OF THE DRAWINGS

These and another objects, features and characteristics of the present invention will be appreciated from a study of the following detailed description, the appended claims, and drawings, all of which form parts of this application. In the drawings, same portions or corresponding portions are put the same numerals each other to eliminate redundant explanation. In the drawings:

DESCRIPTION OF THE PREFERRED EMBODIMENTS

Hereinafter, a preferred embodiment of the present invention will be explained with reference to accompanying drawings.

Figure 1:
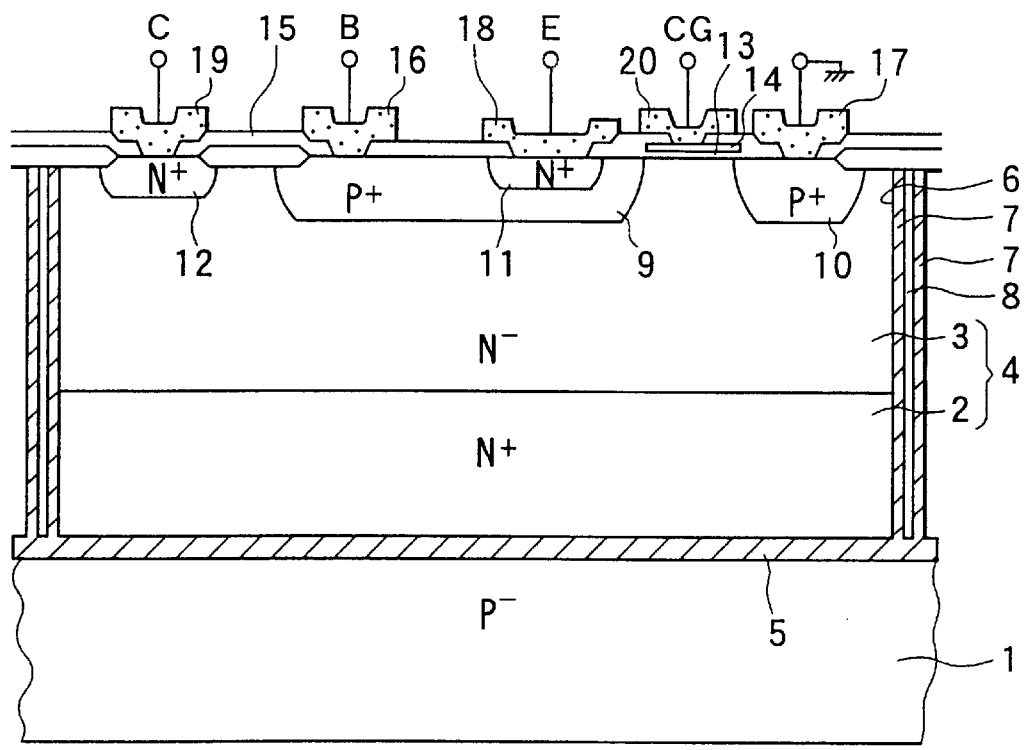
FIG. 1 is a sectional view of a semiconductor device of a preferred embodiment according to the present invention.
Figure 2:
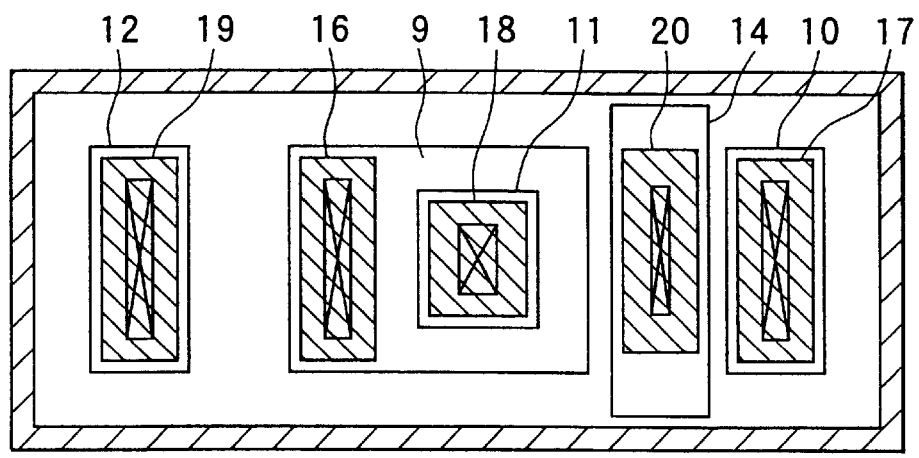
FIG. 2 is a plan view of the semiconductor device of the first embodiment.

As shown in FIGS. 1 and 2, a semiconductor device of the present invention is formed so that a bipolar transistor and a MOS (Metal Oxide Semiconductor) transistor are formed in one element region, which is formed in an SOI (Silicon on Insulator) substrate by being insulated from the other regions by using an insulating trench.

The SOI substrate is made up by bonding a P-type silicon substrate 1 and a silicon substrate 4, which is made up of an N$^+$-type layer 2 and an N$^-$-type layer 3, with an insulating film (silicon oxide film) 5 interposed therebetween. An isolation trench 6 reaching the insulating film 5 from a surface side of the N$^-$-type layer 3 is formed. On a wall surface of the isolation trench 6, an insulating film (silicon oxide film) 7 is formed. A polysilicon 8 is filled in the insulation trench 6. As a result, each of the element regions is formed in the island-shape by being individually isolated and insulated by the isolation trench 6 and the insulating film 7.

A P$^+$-type base region 9, a P$^+$-type excess carrier removing region 10, an N$^+$-type emitter region 11, and an N$^+$-type collector region 12 are formed in the N⁻-type layer 3 of the one element region. Furthermore, a gate oxide film 13 is formed on the surface of the N⁻-type layer 3 between the P⁺-type base region 9 and the P⁺-type excess carrier removing region 10. A polysilicon layer 14 is formed on the gate oxide film 13. The P⁺-type base region 9, P⁺-type excess carrier removing region 10, N⁺-type emitter region 11, the N⁺-type collector region 12, and the polysilicon layer 14 are respectively connected to metallic electrodes 16, 17, 18, 19, and 20, which are made of aluminum or the like, through contact holes formed in an interlayer insulating film (silicon oxide film) 15, Here, a thickness of the gate oxide film 13 is approximately 0.07 µm, and a thickness of the interlayer insulating film 15 is approximately 0.5 µm.

Thus, a bipolar transistor is constructed by the P⁺-type base region 9, the N⁺-type emitter region 11, and the N⁺-type collector region 12. In a case where the bipolar transistor is formed in the island-shaped element region in a similar manner as in the present embodiment, which is insulated and isolated by the isolation trench 6 and the insulating film 7, switching time may be prolonged because excess electrons in the P⁺-type base region 9 may not be immediately extinguished while the bipolar transistor is switched from ON to OFF.

In this embodiment, the P⁺-type excess carrier removing region 10 is provided so that the excess electrons can be immediately removed from the P⁺-type base region 9 and that the switching time can be shortened. That is, a parasitic transistor is defined by using the P⁺-type base region 9, the N⁻-type layer 3, and the P⁺-type excess carrier removing region 10 as a collector. By turning on this parasitic transistor, holes for recombining with the electron are always supplied to the P⁺-type base region 9, so that the excess electrons in the P⁺-type base region 9 can be immediately removed and that the switching time can be shortened.

Furthermore, a P-channel MOS transistor is defined by using the P⁺-type excess carrier removing region 10 as a drain and the P⁺-type base region 9 as a source. Thus, a hybrid element in which the bipolar transistor and the MOS transistor are commonly formed in one element region can be formed. Here, in this embodiment, the MOS transistor is formed in an enhancement type, that is a normally-off type P-channel MOS transistor.

Figure 3:
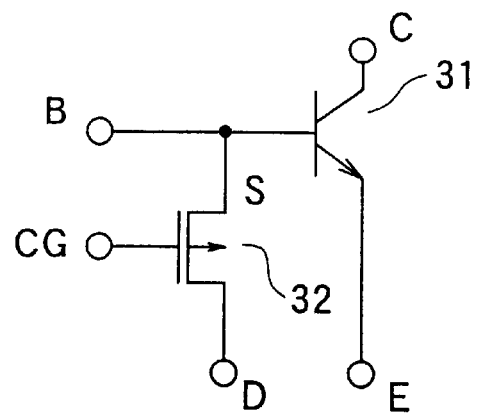
FIG. 3 is an electric circuit diagram of the semiconductor device of the first embodiment shown in FIGS. 1 and 2.

FIG. 3 is an electric circuit diagram of the hybrid device. As shown in this figure, the hybrid element is formed so that the source of the MOS transistor 32 is connected to the base of the bipolar transistor 31. Hence, current flowed between the emitter and the collector of the bipolar transistor 31 can be controlled by operating the MOS transistor 32.

Figure 4:
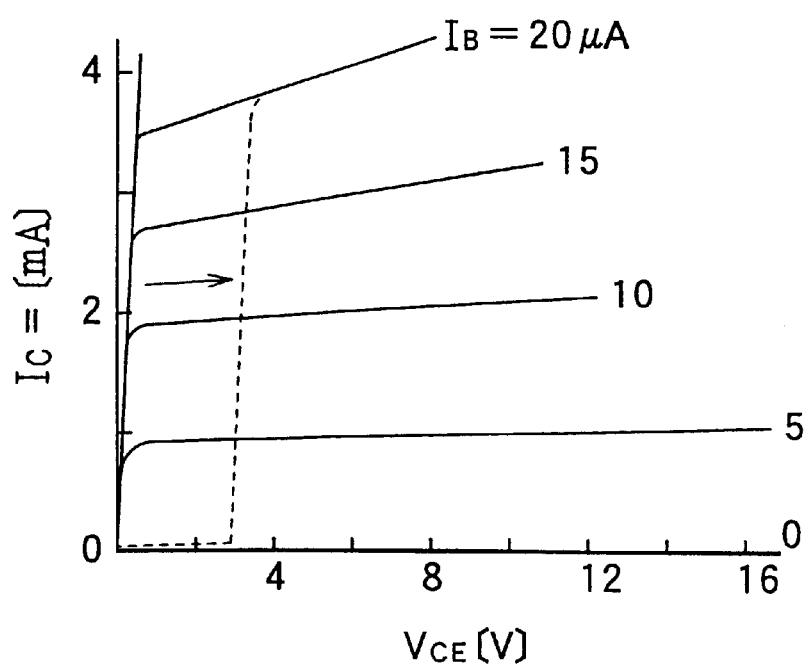
FIG. 4 is a diagram illustrating a relationship between a collector-emitter voltage $V_{CE}$ and a collector current $I_C$ in a transistor 31.

In this case, the bipolar transistor 31 can be turned off by turning on the MOS transistor 32, and a collector current of the bipolar transistor 31 can be controlled by linearly changing current flowed between the source and the drain of the MOS transistor 32. For example, when a gate voltage of the MOS transistor 32 is changed toward a negative direction with respect to a base voltage (=a source voltage of the MOS transistor 32) of the bipolar transistor 31, as shown in FIG. 4, a characteristic of a relationship between the collector-emitter voltage $V_{CE}$ and the collector current $I_C$ of the bipolar transistor 31 can be shifted to a direction shown by an arrow in this figure.

Figure 5:
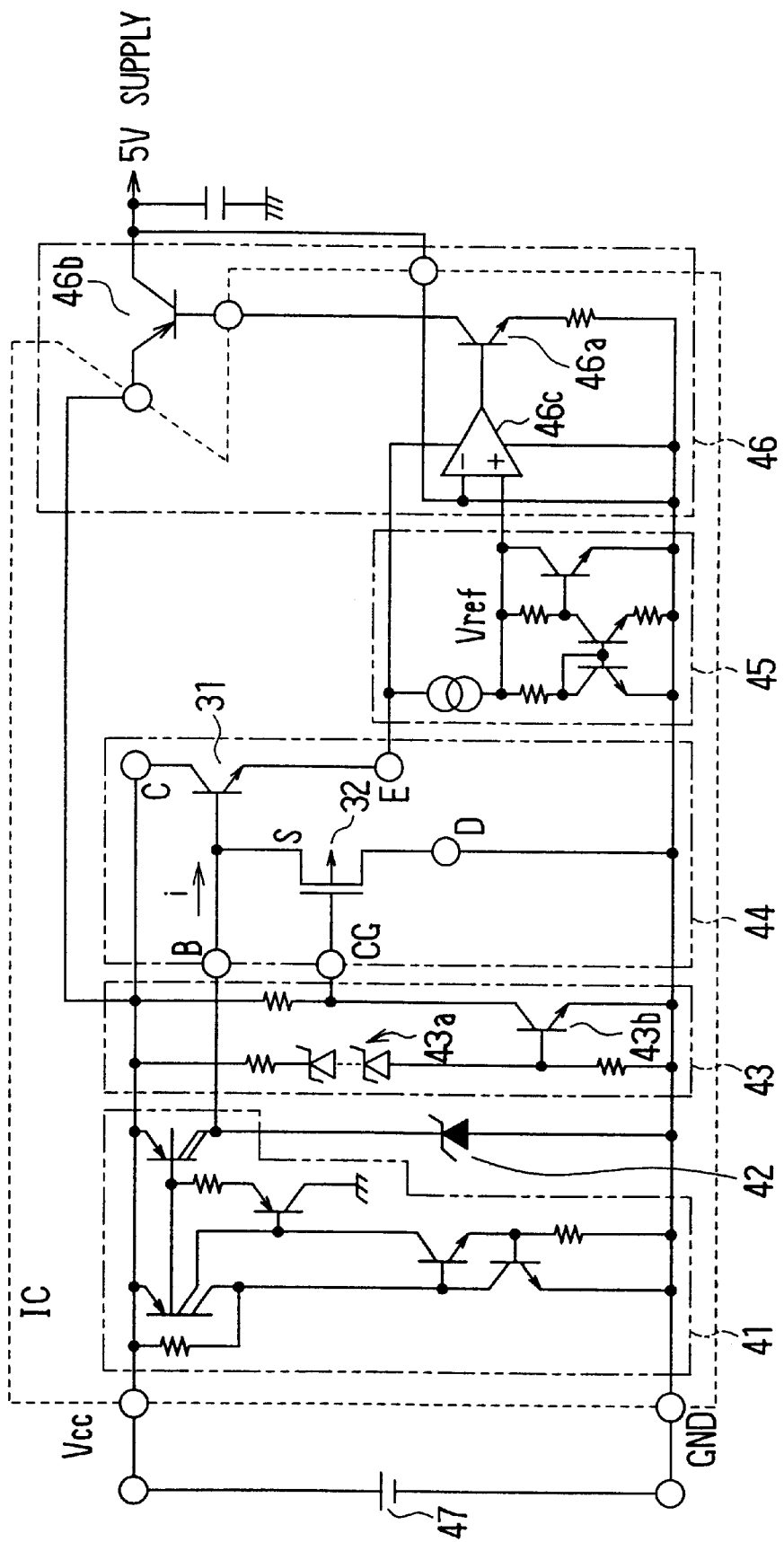
FIG. 5 is an electric circuit diagram when the semiconductor device of this embodiment is applied to a constant voltage circuit.

FIG. 5 shows a modification in which the circuit shown in FIG. 3 is applied to an overcurrent protective circuit. In detail, FIG. 5 shows a constant voltage circuit for supplying stabilized voltage having 5 V to a microcomputer or the like.

Here, the constant voltage circuit is made up of a constant current circuit 41, a constant voltage Zener diode 42, an overvoltage detecting circuit 43, a constant current supplying circuit 44 having an overcurrent protective function, a reference voltage generating circuit 45 for generating reference voltage $V_{ref}$, and a constant voltage generating circuit 46. The constant voltage circuit is connected to a vehicle-mounted battery 47, and supplies constant current generated by the constant current circuit 41 from the constant current supplying circuit 44 to the reference voltage generating circuit 45 and the constant voltage generating circuit 46, so as to output voltage stabilized to 5 V to the microcomputer or the like. Here, an internal portion of an IC is shown by a dotted line.

During a normal operation, the above-described constant voltage supply operation is performed by using an output voltage $V_{CC}$ of the battery 47 having approximately 14 V. However, in a case when the constant voltage circuit is mounted on a vehicle, the output voltage $V_{CC}$ of the battery 47 may largely fluctuate depending on the other loads.

Therefore, the overvoltage detecting circuit 43 is formed so that a Zener diode 43a (in this case, three Zener diodes are connected in series) is turned on (flow current therein) and the bipolar transistor 43b is turned on, when the output voltage $V_{CC}$ is abnormally changed to more than a predetermined value such as 18 V. In this case, the gate voltage of the MOS transistor 32 in the constant current supplying circuit 44 becomes 0 V when the output voltage $V_{CC}$ in accordance with a turning on of the Zener diode. In other words, when the output voltage $V_{CC}$ is abnormally changed to more than the predetermined value such as 18 V, an abnormality signal having 0 V is inputted to the gate of the MOS transistor 32. In this case, a source voltage of the MOS transistor 32 is approximately 6 V due to the constant voltage Zener diode 42, and a voltage between the gate and the source of the MOS transistor 32 becomes larger than a threshold voltage $V_T$. As a result, the MOS transistor 32 is turned on, and the bipolar transistor 31 is turned off. Therefore, no current is supplied to the reference voltage generating circuit 45 and the constant voltage generating circuit 46; transistors 46a and 46b of the constant voltage generating circuit 46 are turned off; and therefore a abnormality handling operation in which no power is supplied to the microcomputer or the like is performed.

Figure 6:
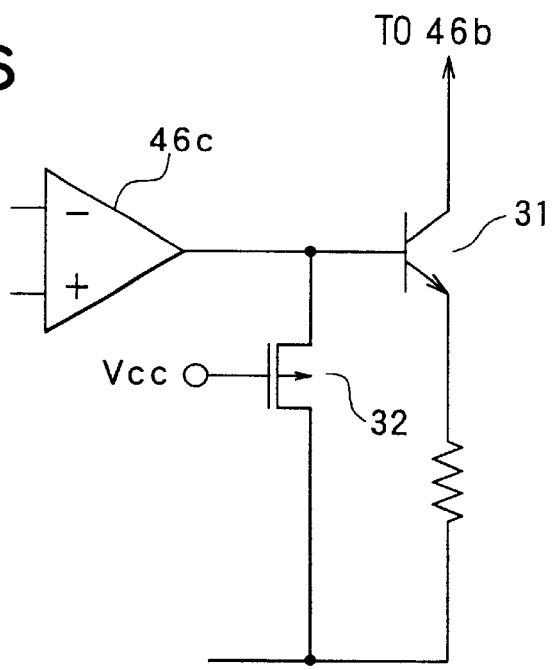
FIG. 6 is a partial electric circuit diagram of a modification of the constant voltage circuit shown in FIG. 6.

Here, instead of using the transistor 46a, the constant voltage generating circuit 46 may be modified as follows. As shown in FIG. 6. the bipolar transistor 31 and the MOS transistor 32 shown in FIG. 3 are provided; an output of an operational amplifier 46c is connected to the base of the bipolar transistor 31; and the output voltage $V_{CC}$ of the battery 47 is applied to the gate of the MOS transistor 32. In this case, since the MOS transistor 32 is turned on and the bipolar transistor 31 is turned off when the output voltage $V_{CC}$ becomes negative voltage, the abnormality handling operation for the negative output voltage $V_{CC}$ can be performed.

Figure 7:
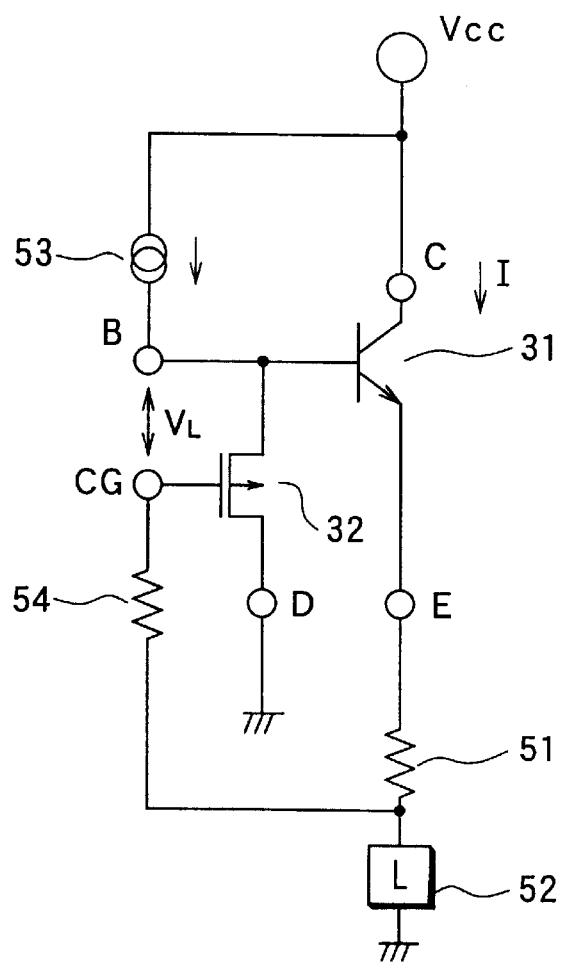
FIG. 7 is an electric circuit diagram when the semiconductor device of this embodiment is applied to a load current supply circuit.

FIG. 7 shows a modification in which the circuit shown in FIG. 3 is applied to a current limitation circuit. In detail, FIG. 7 shows a load current supplying circuit for supplying current I to the load 52 via a shunt resistor 51. Constant current is supplied from a constant current source 53 to the base of the transistor 31; and a voltage between the shunt resistor 51 and the load 52 is inputted to the gate of the MOS transistor 32 via a resistor 54.

Figure 8:
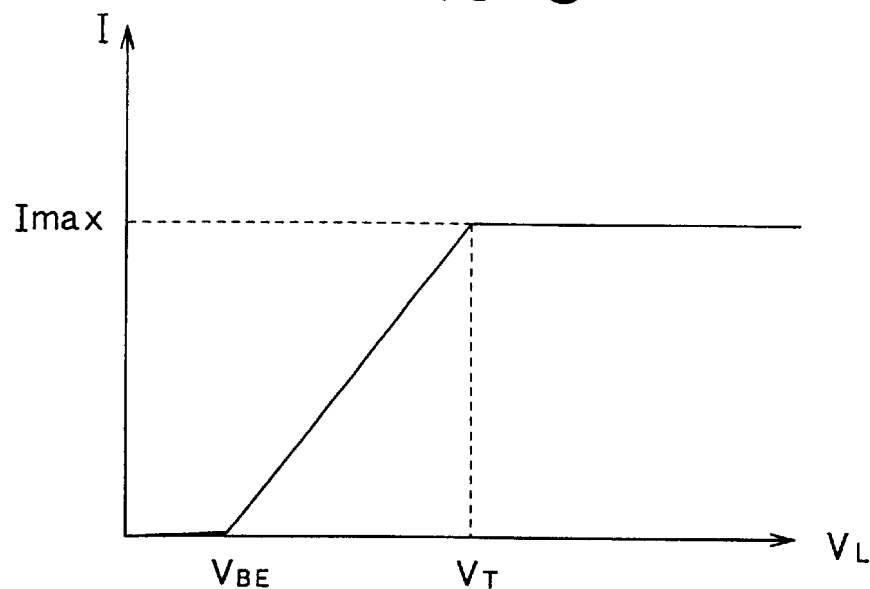
FIG. 8 is a diagram illustrating a relationship between a source-gate voltage $V_L$ and a current I to be supplied to a load 52.

Here, a voltage $V_L$ between the source and the gate of the MOS transistor 32 is equal to a sum of a forward direction voltage between the base and the emitter of the bipolar transistor 31 and a voltage between both ends of the shunt resistor 51 (current I×resistance of the shunt resistor 51). When the current flowing in the bipolar transistor 31 becomes overcurrent and the voltage $V_L$ reaches a threshold voltage $V_T$, current flowed from the constant current source 53 to the bipolar transistor 31 is absorbed (sunk) in the MOS transistor 32. As a result, as shown in FIG. 8, the current I to be supplied to the load 52 is restricted to $I_{max}$.

As the circuit shown in FIG. 3 can be applied to the current limit circuit, by inputting voltage corresponding to the current flowed in the bipolar transistor 31 to the gate of the MOS transistor 32.

Figure 9:
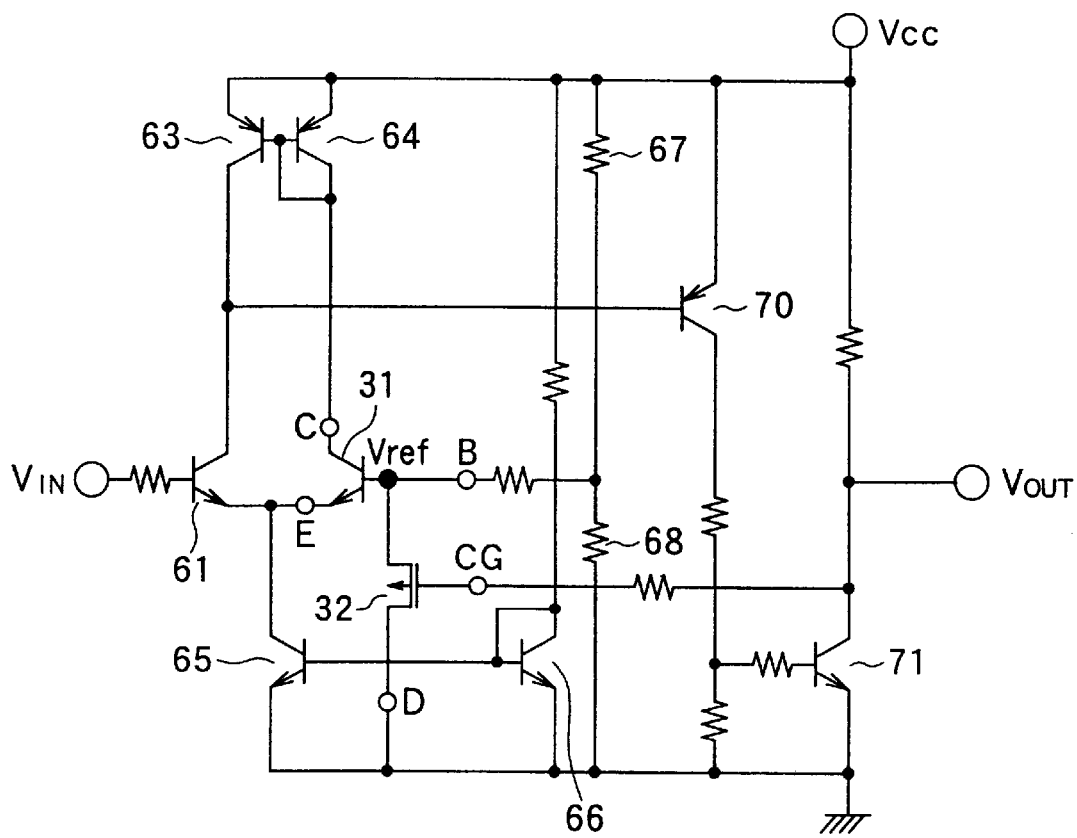
FIG. 9 is an electric circuit diagram when the semiconductor device of this embodiment is applied to a comparator.

FIG. 9 shows a modification in which the circuit shown in FIG. 3 is applied to a comparator.

Before starting an explanation of a comparator of this embodiment, a comparator of a related art will be briefly explained with reference to FIG. 10. The comparator includes: a transistor 61 in which an input voltage $V_{IN}$ is inputted to a base thereof; a transistor 62 in which a reference voltage $V_{ref}$ is inputted to a base thereof; transistors 63 and 64 formed in a current-mirror circuit with each other to supply identical current to each collector of each transistor 61 and 62, and transistors 65 and 66 formed in a current-mirror circuit with each other for deciding an operation current of the comparator. The comparator is operated so that the transistors 61 and 62 are differentially operated. The reference voltage $V_{ref}$ is generated by dividing using resistors 67, 68 and 69. Furthermore, a transistor 70 whose base is connected to the collector of the transistor 61, and a transistor 71 whose base is connected to the collector 70, and output voltage $V_{OUT}$ is outputted from the collector of the transistor 71. The resistor 69 can be shorted by the transistor 72.

According to the comparator of the related art, when the input voltage $V_{IN}$ is higher than the reference voltage $V_{ref}$, base current flows in the transistor 70, so that the transistors 70 and 71 are turned on, and that the output voltage $V_{OUT}$ becomes low level. At the same time, since the transistor 72 is also turned on, the resistor 69 is shorted and the reference voltage $V_{ref}$ falls.

Figure 11:
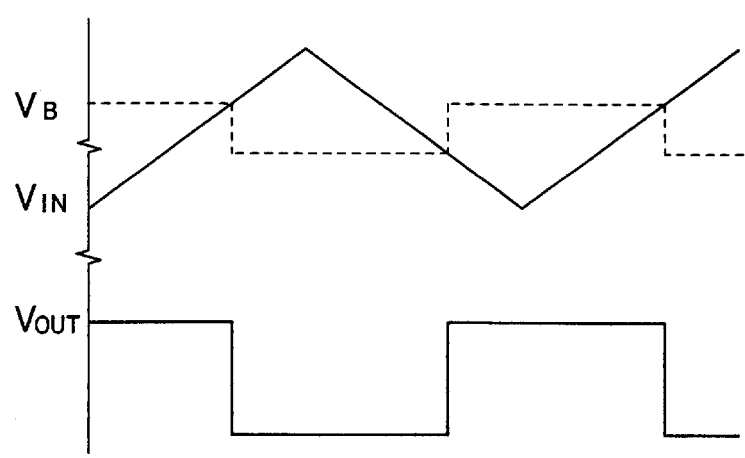
FIG. 11 is a time chart illustrating an operation of the comparator.

In this situation, the input voltage $V_{IN}$ becomes lower than the reference voltage $V_{ref}$, the transistors 70 and 71 are turned off, and the output voltage $V_{OUT}$ becomes high level. At the same time, since the transistor 72 is also turned off, the reference voltage $V_{ref}$ rises. Therefore, as shown in FIG. 11, the output voltage $V_{OUT}$ is changed in accordance with the input voltage $V_{IN}$, and further the reference voltage $V_{ref}$ is changed in accordance with the output voltage $V_{OUT}$. In this way, the comparator, which has a hysteresis characteristic in which chattering of the output voltage $V_{OUT}$ is prevented, can be formed.

Figure 10:
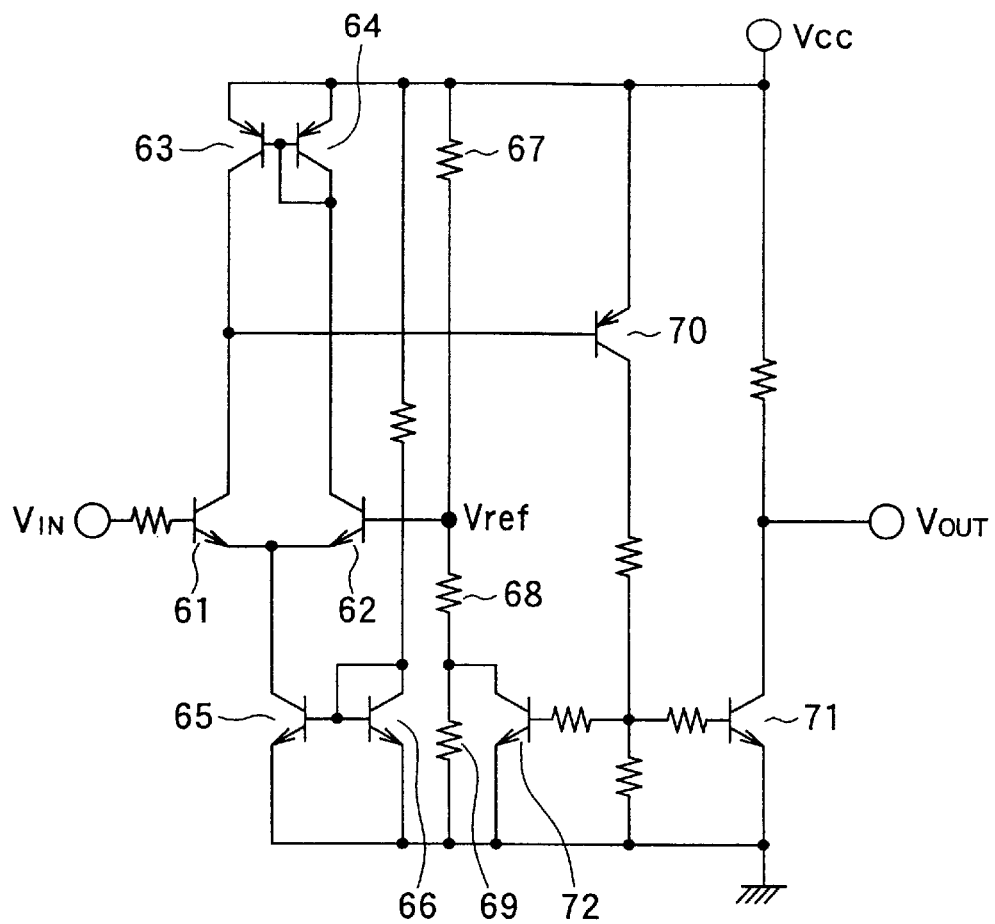
FIG. 10 is an electric circuit diagram of a comparator of a related art.

On the contrary, according to the comparator shown in FIG. 9 of this embodiment, the bipolar transistor 31 and the MOS transistor 32 having construction as shown in FIG. 3 are provided instead of the transistors 62 and 72 of the comparator shown in FIG. 10. Furthermore, the reference voltage $V_{ref}$ is inputted to the base of the bipolar transistor 31, and a voltage corresponding to the collector voltage of the transistor 71 is inputted to the gate of the MOS transistor 32.

According to the above-described structure, when the input voltage $V_{IN}$ is higher than the reference voltage $V_{ref}$, base current flows in the transistor 70, so that the transistors 70 and 71 are turned on, and that the output voltage $V_{OUT}$ becomes low level. At a result, the gate voltage of the MOS transistor 32 falls, the MOS transistor 32 turns on, and therefore the base voltage (i.e., the reference voltage $V_{ref}$) of the bipolar transistor 31 becomes higher than the gate voltage of the MOS transistor 32 by the threshold voltage $V_T$.

In this situation, the input voltage $V_{IN}$ becomes lower than the reference voltage $V_{ref}$, the transistors 70 and 71 are turned off, and the output voltage $V_{OUT}$ becomes high level. As a result, since the gate voltage of the MOS transistor 32 rises and the MOS transistor 32 is turned off, the base voltage (i.e., the reference voltage $V_{ref}$) of the bipolar transistor 31 time rises to a voltage divided by the resistors 67 and 68. In this way, the comparator, which has a hysteresis characteristic in which chattering of the output voltage $V_{OUT}$ is prevented, can be formed.

Figure 12:
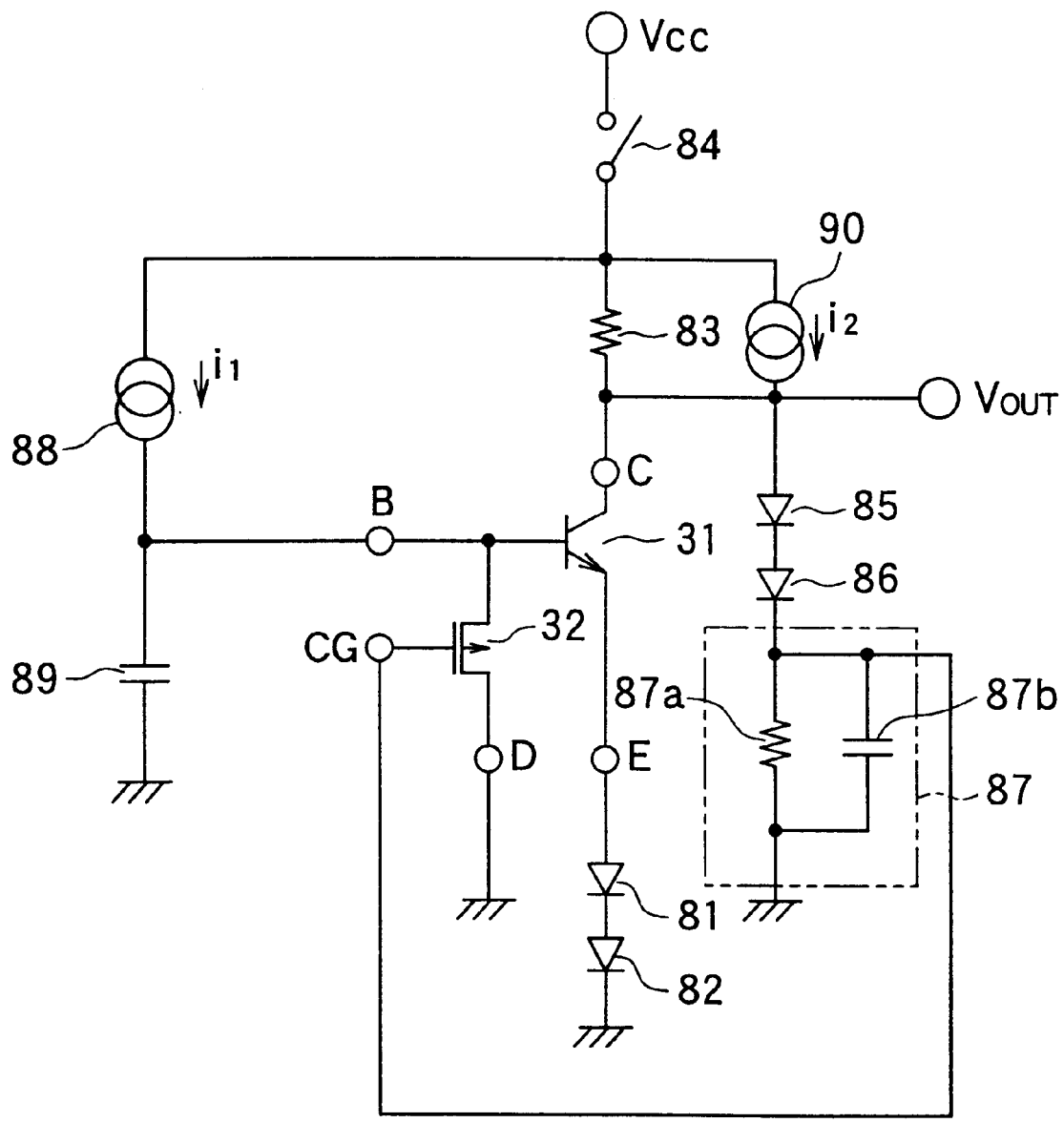
FIG. 12 is an electric circuit diagram when the semiconductor device of this embodiment is applied to an oscillator.

FIG. 12 shows a modification in which the circuit shown in FIG. 3 is applied to an oscillator.

The oscillator includes the bipolar transistor 31 and the MOS transistor 32 as shown in FIG. 3. The emitter of the bipolar transistor 31 is connected to diodes 81 and 82; the collector is connected to a switch 84 via a resistor 83, and is connected to a time constant circuit 87 via diodes 85 and 86. The time constant circuit 87 is made up of resistors 87a and 87b, and is charged or discharged based on turning on or off of the bipolar transistor 31. An output voltage (i.e., terminal voltage of a capacitor 87b) of the time constant circuit 87 is inputted to the gate of the MOS transistor 32. Furthermore, constant current $i_1$ is supplied from the switch 84 to a capacitor 89 via a constant current source 88, and constant current $i_2$ is supplied to the diode 85 via a constant current source 90.

Figure 13:
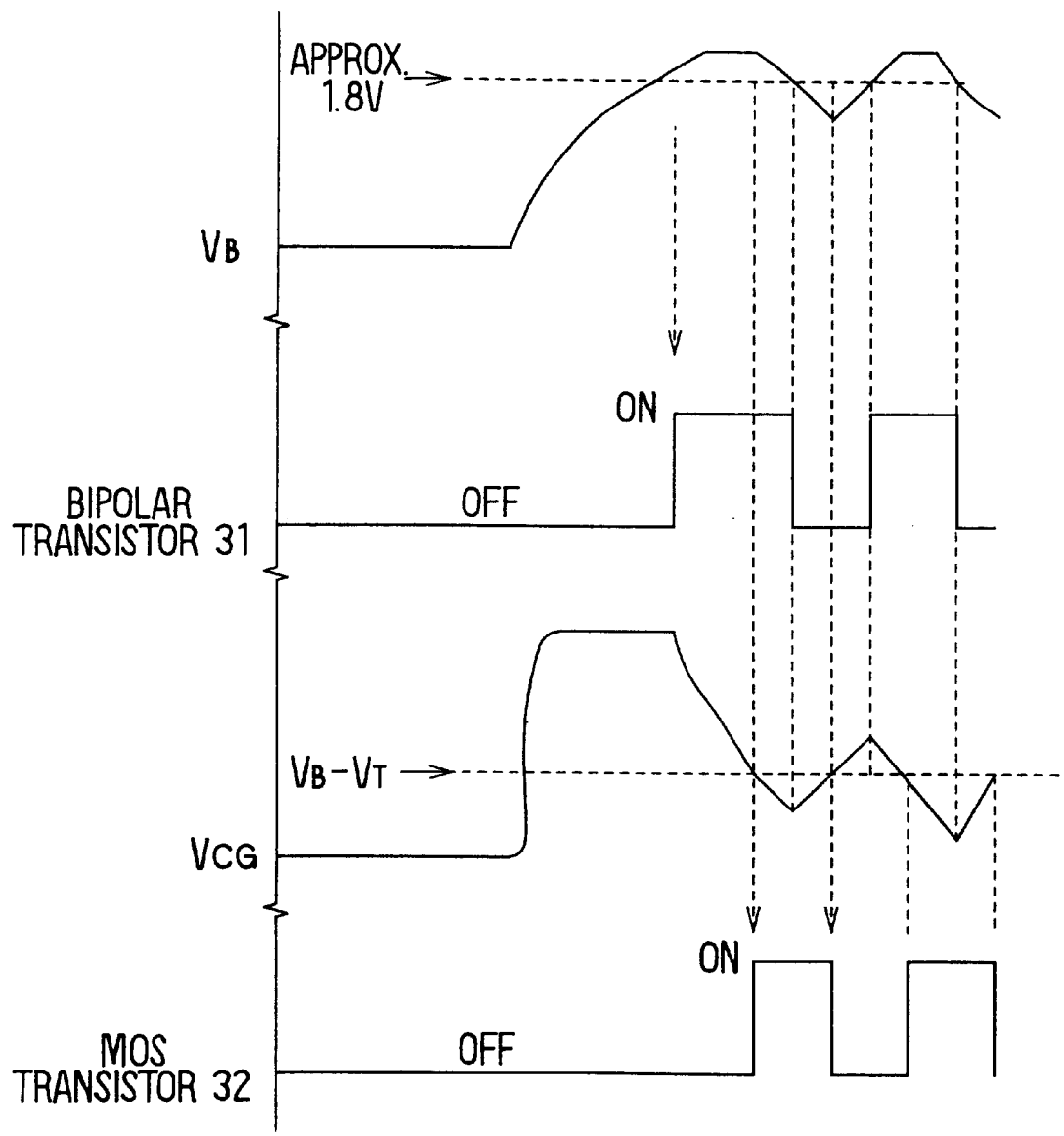
FIG. 13 is a time chart illustrating an operation of the oscillator.

Next, an operation of the above-described oscillator will be explained. FIG. 13 shows a time chart of each portion. When the switch 84 is turned on, terminal voltages of the capacitors 89 and 87b rise as a result of being supplied of constant current from the constant current sources 88 and 90. In this time, when the terminal voltage of the capacitor 87b is set higher than that of the capacitor 89 (for example, capacitance of the capacitor 87b is set smaller than that of the capacitor 89), the MOS transistor 32 is turned off, and a base voltage $V_B$ of the bipolar transistor 31 rises under this situation.

When the base voltage $V_B$ reaches approximately 1.8 V, the transistor 31 turns on, and the output voltage $V_{OUT}$ becomes low level. A gate voltage $V_{CG}$ of the MOS transistor 32 falls with a time constant defined by the resistance 87a and the capacitor 87b. When a difference between the gate voltage $V_{CG}$ and the source voltage (i.e., the base voltage $V_B$ of the transistor 31) becomes equal to or smaller than the threshold voltage $V_T$, the MOS transistor 32 turns off.

Furthermore, the base voltage $V_B$ of the transistor 31 becomes equal to or less than approximately 1.8 V, the bipolar transistor 31 turns off, and the output voltage $V_{OUT}$ becomes high level. After that, the gate voltage $V_{CG}$ of the MOS transistor 32 rises with the time constant defined by the resistance 87a and the capacitor 87b. An oscillating operation is performed by repeating these operations, so that the output voltage $V_{OUT}$ becomes an oscillating signal.

Here, the oscillator shown in FIG. 12 can be applied to a power-on reset circuit in a microcomputer controlling.

In this embodiment, as shown in FIG. 1, the element region is isolated and insulated by using the isolation trench 6, however, the element region may be isolated and insulated by using a PN-junction.

Figure 14:
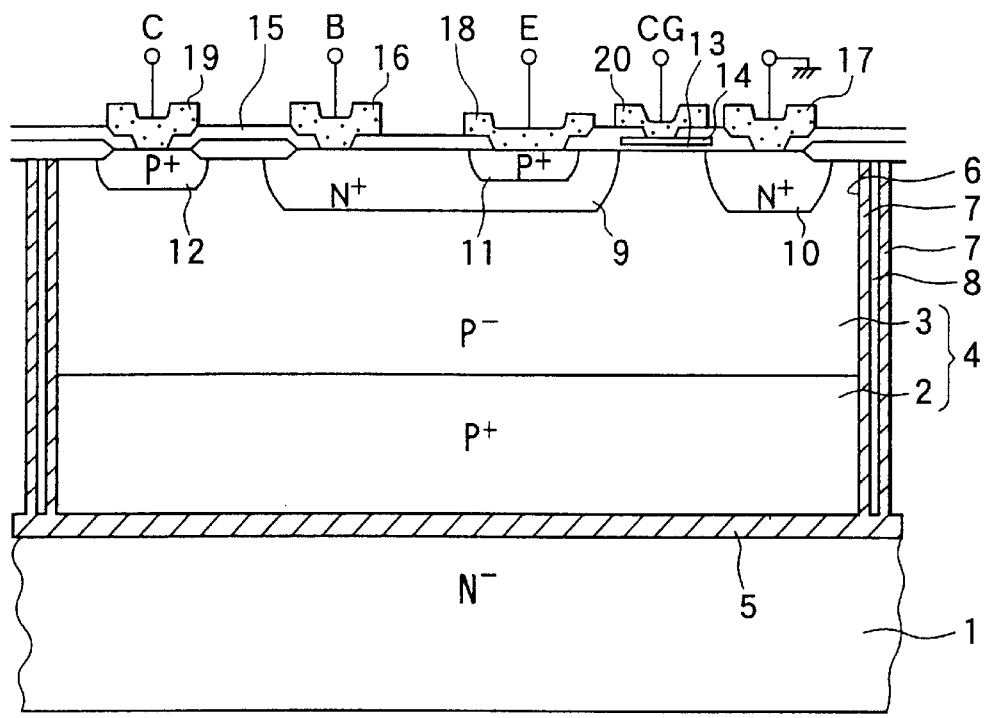
FIG. 14 is a sectional view of a semiconductor device of a modified embodiment according to the present invention.
Figure 15:
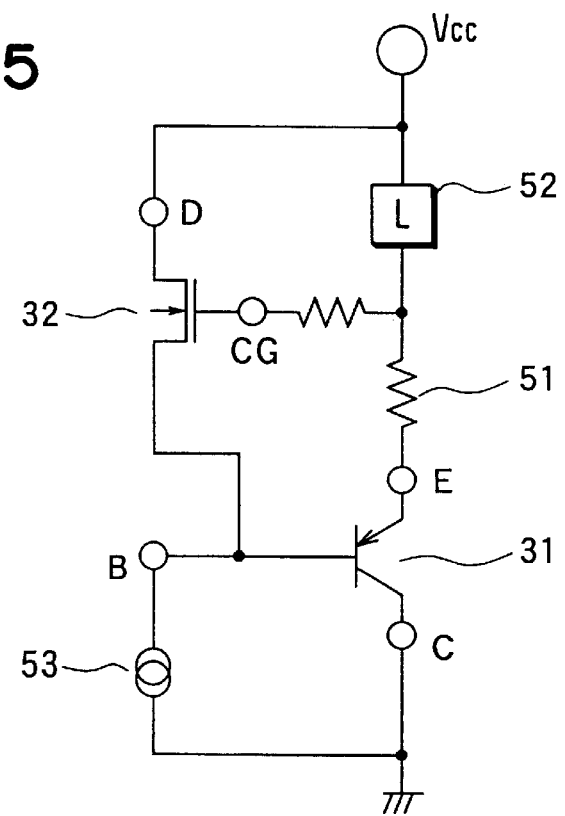
FIG. 15 is an electric circuit diagram when the semiconductor device shown in FIG. 14 is applied to a load current supply circuit.

Conductivity of each region of the bipolar transistor 31 and the MOS transistor 32 may be exchanged to the opposite conductivity, as shown in FIG. 14. In this case, when this hybrid element is applied to the current limit circuit as shown in FIG. 7, an electric circuit diagram of this circuit is constructed as shown in FIG. 15.

In FIGS. 1 and 14, the metallic electrode 17 is connected to ground level (GND), however, the metallic electrode 17 may be connected to another terminal, from which particular voltage can be supplied. In this case, the drain voltage of the MOS transistor can be positively changed. As a result, flexibility of design can be improved even if the present invention is applied to the other circuit different from the above-described several circuits.

What is claimed is:

1. A semiconductor device circuit comprising:
   a substrate;
   an element region formed in the substrate, and isolated and insulated from other element regions formed in the substrate;
   a semiconductor layer formed in the element region and having a first conductivity type;
   a bipolar transistor formed in the semiconductor layer comprising:
      a base region formed in the semiconductor layer and having a second conductivity type;
      an emitter region formed in the base region and having the first conductivity type; and
      a collector region formed in the semiconductor layer and having the first conductivity type;
   an insulated gate transistor formed in the semiconductor layer in which the bipolar transistor is formed and using the base region as one of a source and a drain thereof, the insulated gate transistor comprising:
      a source-drain region formed in the semiconductor layer and having the second conductivity type, for use as another of the source and the drain of the insulated gate transistor; and
      a gate formed on the surface of the semiconductor layer between the base region and the source-drain region with a gate oxide film interposed therebetween;
   an excess carrier removing region, formed in the semiconductor layer and having the second conductivity type for defining a parasitic transistor with the semiconductor layer and the base region, the parasitic transistor for removing excess carriers in the base region; and
   a circuit portion connected to the bipolar transistor and the insulated gate transistor for inputting an abnormality signal to the gate of the insulated gate transistor so that the bipolar transistor is turned off by activation of the insulated gate transistor.

2. A semiconductor device comprising:
   a substrate;
   an element region formed in the substrate, and being isolated and insulated from the other element regions to be formed in the substrate;
   a semiconductor layer formed in the element region, and having a first conductivity type;
   a bipolar transistor formed in the semiconductor layer comprising:
      a base region formed in the semiconductor layer and having a second conductivity type;
      an emitter region formed in the base region and having the first conductivity type; and
      a collector region formed in the semiconductor layer and having the first conductivity type;
   an insulated gate transistor formed in the semiconductor layer in which the bipolar transistor is formed and using the base region as one of a source and a drain thereof, the insulated gate transistor comprising:
      a source-drain region formed in the semiconductor layer and having the second conductivity type, for use as another of the source and the drain of the insulated gate transistor; and
      a gate formed on the surface of the semiconductor layer between the base region and the source-drain region, with a gate oxide film interposed therebetween;
   an excess carrier removing region formed in the semiconductor layer and having the second conductivity type for defining a parasitic transistor with the semiconductor layer and the base region, the parasitic transistor for removing excess carriers in the base region; and
   a circuit portion connected to the bipolar transistor and the insulated gate transistor for inputting a gate signal to the gate in proportion to current flow to the bipolar transistor so that a base current of the bipolar transistor is controlled by activation of the insulated gate transistor so as to control current flow to the bipolar transistor when the current exceeds a predetermined limit.

3. A semiconductor device circuit comprising:
   a substrate;
   an element region being formed in the substrate, and being isolated and insulated from the other element regions to be formed in the substrate;
   a semiconductor layer being formed in the element region, and having a first conductivity type;
   a bipolar transistor being formed in the semiconductor layer, including:
      a base region being formed in the semiconductor layer, and having a second conductivity type;
      an emitter region being formed in the base region, and having the first conductivity type; and
      a collector region being formed in the semiconductor layer, and having the first conductivity type;
   an insulated gate transistor formed in the semiconductor layer in which the bipolar transistor being formed, and using the base region as one of a source and a drain thereof, including:
      a source-drain region being formed in the semiconductor layer and having the second conductivity type, for being used as another of the source and the drain of the insulated gate transistor; and
      a gate formed on the surface of the semiconductor layer, where between the base region and the source-drain region, with a gate oxide film interposed therebetween;
   a differential transistor for differentially operating with the bipolar transistor, having a base; and
   a comparator controlling portion being connected to the bipolar transistor, the insulated gate transistor, and the differential transistor, for inputting a reference voltage to the base region of the bipolar transistor and inputting an input voltage to the base of the differential transistor so that an output voltage is generated in response to a relation between the reference voltage and the input voltage, and for inputting a voltage corresponding to the output voltage to the gate of the insulated gate transistor so that the reference voltage to be inputted to the base of the bipolar transistor is changed in response to the output voltage.

4. A semiconductor device circuit comprising:

a substrate;

an element region being formed in the substrate, and being isolated and insulated from the other element regions to be formed in the substrate;

a semiconductor layer being formed in the element region, and having a first conductivity type;

a bipolar transistor being formed in the semiconductor layer, including:

a base region being formed in the semiconductor layer, and having a second conductivity type;

an emitter region being formed in the base region, and having the first conductivity type; and a collector region being formed in the semiconductor layer, and having the first conductivity type;

an insulated gate transistor formed in the semiconductor layer in which the bipolar transistor being formed, and using the base region as one of a source and a drain thereof, including:

a source-drain region being formed in the semiconductor layer and having the second conductivity type, for being used as another of the source and the drain of the insulated gate transistor; and a gate formed on the surface of the semiconductor layer, where between the base region and the source-drain region, with a gate oxide film interposed therebetween;

a time constant circuit for being charged and discharged in response to a switching of the bipolar transistor; and an oscillator controlling portion being connected to the bipolar transistor, the insulated gate transistor, and the time constant circuit, for inputting an output of the time constant circuit to the gate of the insulated gate transistor, so that the insulated gate transistor can switch the bipolar transistor based on a relationship between a base voltage of the bipolar transistor and the output of the time constant circuit, and that oscillating signal is generated.

5. A device according to claim 1, further comprising a power supply line connected to the excess carrier removing region for supplying a particular voltage thereto.

6. A device according to claim 1, wherein the substrate includes:

a support substrate on which the semiconductor layer is formed with an insulating film interposed therebetween; and an isolation trench formed from a surface side of the semiconductor layer to the insulating film, so that the element region where the bipolar transistor and the insulated gate transistor are formed is formed in an island-shape, which is isolated and insulated from the other element regions to be formed in the substrate.

7. A device according to claim 1, further comprising a load connected to the emitter and the gate;

wherein the circuit portion comprises a resistor interposing between the load and the emitter of the bipolar transistor, and wherein the abnormality signal is caused by voltage drop at the resistor.

8. A semiconductor device circuit comprising:

a substrate;

an element region formed in the substrate and isolated and insulated from other element regions to be formed in the substrate;

a semiconductor layer formed in the element region, and having a first conductivity type;

a bipolar transistor formed in the semiconductor layer comprising:

a base region formed in the semiconductor layer and having a second conductivity type;

an emitter region formed in the base region and having the first conductivity type; and a collector region formed in the semiconductor layer and having the first conductivity type;

an insulated gate transistor formed in the semiconductor layer in which the bipolar transistor is formed and using the base region as one of a source and a drain thereof, the insulated gate transistor comprising:

a source-drain region formed in the semiconductor layer and having the second conductivity type, for use as another of the source and the drain of the insulated gate transistor; and a gate formed on the surface of the semiconductor layer between the base region and the source-drain region with a gate oxide film interposed therebetween;

an excess carrier removing region, formed in the semiconductor layer and having the second conductivity type for defining a parasitic transistor with the semiconductor layer and the base region, the parasitic transistor for removing excess carriers in the base region;

a circuit portion connected to the bipolar transistor and the insulated gate transistor for inputting an abnormality signal to the gate of the insulated gate transistor so that the bipolar transistor is turned off by activation of the insulated gate transistor; and a driven circuit to which electrical power is supplied through the bipolar transistor and that is deactivated when the bipolar transistor is turned off.

9. A semiconductor device according to claim 8, further comprising an output transistor, wherein the driven circuit is a control circuit for controlling the output transistor.

10. A semiconductor device according to claim 6, wherein the isolation trench comprises polysilicon therein and an insulating film on a wall surface of the isolation trench.

* * * * *